United States Patent [19]

Willett et al.

[11] 3,746,997

[45] July 17, 1973

[54] ADAPTIVE DIGITAL FREQUENCY DISCRIMINATOR

[75] Inventors: Richard M. Willett, Boone; David P. Passeri, Davenport, both of Iowa

[73] Assignee: Iowa State University Research Foundation, Inc., Ames, Iowa

[22] Filed: Nov. 16, 1971

[21] Appl. No.: 199,200

[52] U.S. Cl. ................. 325/349, 325/320, 328/140, 329/122

[51] Int. Cl. ............................................ H03d 3/02

[58] Field of Search ..................... 325/30, 320, 346, 325/349, 487, 489, 490; 178/66 R, 88; 235/152 R, 156 R; 328/140, 141, 138; 329/122, 123

[56] References Cited

UNITED STATES PATENTS

| | | | |
|---|---|---|---|
| 3,248,659 | 4/1966 | Giger et al. | 325/487 |
| 3,281,698 | 10/1966 | Rose, Jr. et al. | 325/489 |
| 3,629,509 | 12/1971 | Glaser | 235/152 |
| 3,614,639 | 10/1971 | Belman | 178/66 R |

*Primary Examiner*—Benedict V. Safourek
*Attorney*—James J. Hill

[57] ABSTRACT

First and second digital filters having similar transfer characteristics are arranged to have their center frequencies tuned to either side of a composite center frequency so that their characteristics are symmetrical relative to that composite center frequency. The digital filters receive a common input signal known to vary slightly in frequency; and each filter generates an output signal representative of the component of the input signal within its bandwidth. The output signals of the filters are detected and one is subtracted from the other to generate an error signal which is representative of the difference between the frequency component of the input signal and the composite center frequency of the digital filters. A feedback loop varies the sampling rate of digital filters to minimize the error signal, indicating that the composite center frequency of the digital filters is equal to the frequency of the input signal. The system thus tracks the frequency of the input signal.

6 Claims, 3 Drawing Figures

PATENTED JUL 17 1973 3,746,997

INVENTORS
Richard M. Willett and
David P. Passeri
BY James J. Hill
ATTORNEY

ADAPTIVE DIGITAL FREQUENCY DISCRIMINATOR

BACKGROUND AND SUMMARY

The present invention relates to a system for frequency discrimination of electrical signals.

Frequency discrimination is frequently performed in electronic systems, such as FM radio receivers, particularly those which have automatic frequency control. In such systems, the frequency of a tuned circuit is changed by changing a variable reactance element so as to cause the signal across the filter to be a maximum, thus indicating that the frequency to which the filter is tuned is equal to the frequency of a received signal. Such systems normally employ conventional analog circuitry, and all of the signal processing is accomplished with analog electrical signals.

The present invention makes use of two digital filters having similar transfer characteristics but tuned to different center frequencies. The center frequencies of the two digital filters are located at a predetermined frequency difference from a composite center frequency so that their characteristics are symmetrical relative to the composite center frequency. The digital filters receive a common input signal of unknown frequency, and each generates an output signal representative of the component of the input signal within its band. The output signals of the digital filters are detected and subtracted to generate an error signal. The error signal is representative of the difference between the frequency component of the input signal and the component center frequency of the digital filters. A feedback loop which may contain an integrator varies the sampling rate of the digital filters in a similar manner until the error signal is minimized, indicating that the composite center frequency of the digital filters is equal to the frequency of the input signal. Thus, the present invention is able to track the frequency of the input signal very accurately. Uses to which the present invention may be put are automatic frequency control in FM receivers, and in spectrum analyzers for determining the frequency of an input signal, wherein the output of the integrator is the signal representative of the input frequency. A particular use of the adaptive frequency discriminator in tracking a bending mode of a flexible aircraft is disclosed.

Other features and advantages of the present invention will be apparent to persons skilled in the art from the following detailed description of a preferred embodiment accompanied by the attached drawing.

THE DRAWING

DETAILED DESCRIPTION

Figure 1:
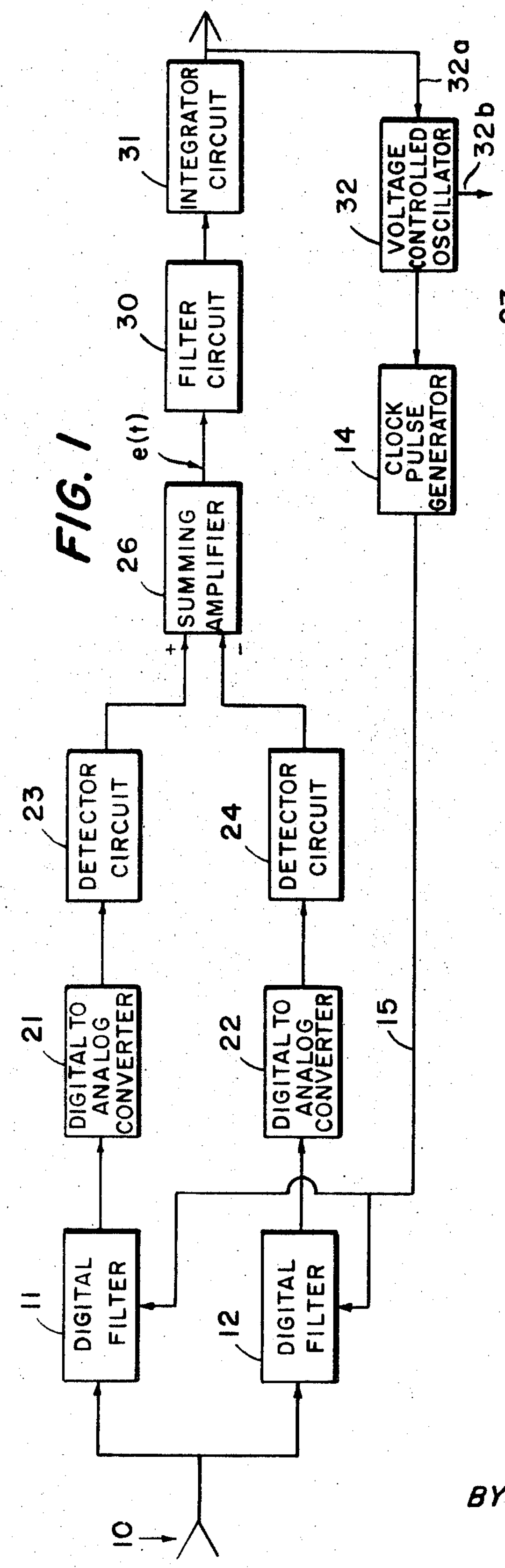
FIG. 1 is a block schematic diagram of a system incorporating the present invention.

Turning then to FIG. 1, reference numeral 10 generally designates an input terminal to the system at which the input signal is received. The input signal is the signal which is operated on or processed by the system of FIG. 1, and it may be, for example, a signal representative of the instantaneous oscillatory motion of the frame of an aircraft or missile in flight. The signal received at the input terminal 10 is in the form of a digital signal, either in serial or parallel form. Thus, if the output signal of a sensor is in analog form, a conventional analog-to-digital converter must be employed.

The input digital signal is fed to the input terminals of two separate digital filters designated respectively by reference numerals 11 and 12. Digital filters are well-known in the art. A digital filter is a real-time, special purpose digital computer which may be programmed so as to exhibit a desired transfer characteristic. The coefficients of the filter for a desired transfer function are entered into a program controlling the operation of the filter, and it is operated by means of an external clock pulse generator 14 which generates an output pulse transmitted along a line 15 to control the sampling rate of each of the digital filters 11, 12 in common.

Digital filters which may be used as the digital filters 11, 12, of the illustrated embodiment are described in an article entitled "Programable Digital Filter Performs Multiple Functions" by A. T. Anderson in Electronics, Oct. 26, 1970. Even though the coefficients entered into the program of the digital filter determine its transfer characteristic for a given center frequency, it is known that by varying the sampling rate (i.e., the interval between sampling pulses from the clock-pulse generator 14), the center frequency of the digital filter will also vary. That is to say, for a fixed location of poles and zeros in the $z$-plane of the transfer characteristic of the filter, the product of the sampling period (T) and the center frequency of the filter ($\omega_c$) is a constant, as expressed in the following equation $$\omega_C\, T = k$$

where $k$ is a constant. Thus, if the sampling time of the filter is changed, its center frequency will be changed in inverse relation.

Figure 2:
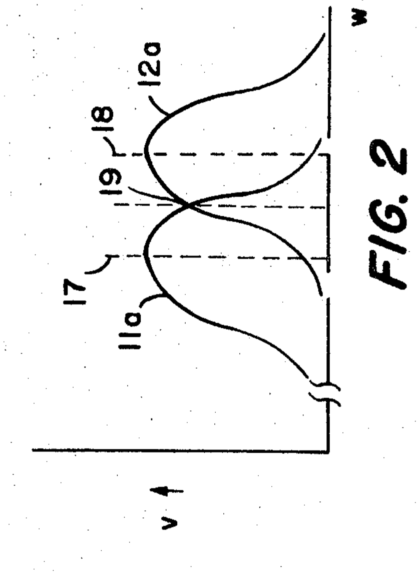
FIG. 2 is a graph showing the frequency spectra of the two digital filters employed.

Turning now to FIG. 2, the abscissa represents frequency and the ordinate represents voltage. The two bell-shaped curves 11a and 12a represent respectively the frequency transfer characteristics of the digital filters 11 and 12. For purposes of explanation, each of the digital filters 11, 12 may have a transfer characteristic of a Butterworth bandpass filter. The coefficients in the recursive equations describing each digital filter remain fixed throughout, so the general shape of the transfer characteristics 11*a*, 12*a* are also fixed. The center frequency for the characteristic 11a is denoted by the vertical line 17 and the corresponding center frequency for the characteristic 12*a* is denoted 18. The coefficients for the difference equations describing the digital filters 11 and 12 are derived by applying the $z$-transform to the $s$-transform of a Butterworth $s$-filter preceded by a zero order hold. The coefficients are chosen so that the half power points of the characteristics 11*a*, 12*a* of the filters coincide, as indicated by the point 19 in FIG. 2. The filters are preferably designed to have identical $\Delta f$'s (i.e., frequency bandwidth at the half-power points in their respective characteristics) so that when the sample rate changes, the bandwidth of each filter will change by the same amount.

Since the pole-zero locations of the transfer function of the digital filter and the $z$-plane are dependent on the sampling rate, a priori knowledge of the frequency distribution of the input signal to be tracked is assumed. For a band limited signal with mean input frequency $\bar{\omega}$, the largest sampling interval $\bar{T}$ must be chosen so that the sampling theorem is not violated for the highest frequency component present in the frequency distribution.

The output of the digital filters 11, 12 are fed to digital-to-analog converters respectively labelled 21 and 22. These digital-to-analog converters may be constructed according to any of a number of techniques well-known in the art. The output of the digital-to-analog converter 21 is fed to a detector 23 and the output of the digital-to-analog converter 22 is fed to a similar detector 24. Each of the detectors 23, 24 may likewise be conventional circuits, such as peak detectors, square law detectors, full-wave rectifiers or half-wave rectifiers. Alternatively, the detecting function could be performed digitally, thus obviating the need for the digital-to-analog converters.

The output of the detector circuit 23 is a signal having an amplitude representative of the frequency component of the input signal which has passed through the filter 11, and similarly, the output signal of the detector circuit 24 is representative of the amount of input signal that has passed through the digital filter 12. The output of the detector circuits 23, 24 are coupled respectively to the plus and minus inputs of a summing amplifier circuit 26, the output signal of which is an error signal, $e(t)$, representative of the difference between the output signals of the detectors 23, 24. This error signal is approximately proportional to the difference between the frequency component of the input signal and the composite center frequency of the filters, so long as the difference is small.

Figure 3:
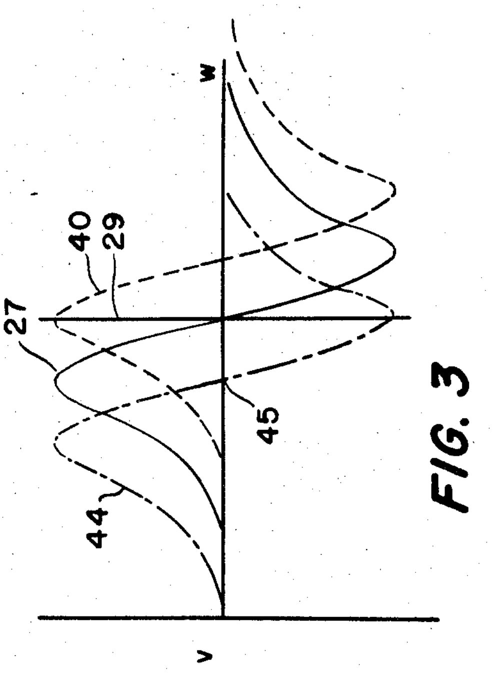
FIG. 3 is a graph of an idealized composite response characteristic of the digital filters connected in subtractive mode and showing the translation along the frequency axis of the composite frequency spectrum as the sampling rate varies.

The frequency response of the system thus far described is illustrated in FIG. 3 by the solid curve 27. The curve is symmetrical about a composite center frequency indicated by the vertical line 29 which corresponds to the frequency of the coincident half power points 19 of the characteristics 11*a*, 12*a* of the individual digital filters 11 and 12 respectively. The composite characteristic 27 results from the use of the summing amplifier 26. That is, if the frequency of the input signal is below the composite center frequency 29, more signal will pass through the digital filter 11 because its transfer characteristic 11*a* dominates at frequencies below its upper half power point 19 and hence the output signal of the summing amplifier 26 will be positive. If, on the other hand, the frequency of the input signal is above the composite center frequency 29, then more signal will pass through the digital filter 12, and the error signal which is the output of the summing amplifier 26 will be negative in polarity.

Returning now to FIG. 1, the error signal $e(t)$ is coupled to a filter circuit 30 to remove any ac components, and the resulting signal is fed through an integrator circuit 31. Any number of known integrating circuits may be used to integrate the analog signal which is passed through the filter circuit 30. Alternatively, the summing and integrating functions just mentioned can be performed digitally. The output signal of the integrator circuit, as will be further explained, is a signal representative of the frequency of the input signal, and this output signal is fed to a feedback loop which changes the sampling rate of the digital filters 11, 12 so as to track the frequency of the input signal. Thus, the output signal of the integrator circuit 31 is fed to a voltage control oscillator circuit 32 which may also be of conventional design. The voltage control oscillator circuit 32 is a free-running oscillator designed to oscillate in a specific frequency, but is controllable by means of an analog signal at its input 32*a* to vary about that design frequency. The output signal of the voltage control oscillator circuit 32 is coupled to the input of the clock-pulse generator, the function of which has already been described. The clock-pulse generator 14 is a circuit which generates pulses having fast rise and fall times and a constant amplitude, and any number of conventional circuits, such as relaxation oscillators, may be used to take the sine wave output of the oscillator 32 and convert each half cycle to a corresponding digital pulse, all such digital pulses being of the same polarity to control the sampling rate of the digital filters 11, 12. Alternatively, the voltage controlled oscillator 32 could be constructed to have a pulse output rather than a continuous sine wave, thereby eliminating the need for clockpulse generator 14.

OPERATION

Assume that the frequency of the input signal is above the composite center frequency 29 of the two transfer characteristics of the digital filters 11, 12. The difference between the detected output signals of the digital filters will be negative, thereby causing the output signal $e(t)$ of the summing amplifier circuit 26 to be negative. The output of the integrator circuit 31 will also go negative. This output voltage also controls the frequency of the voltage control oscillator circuit 32 which must then change to increase the sampling frequency. As the sampling interval decreases, the center frequencies 17, 18 of the two characteristics 11*a*, 12*a* of the digital filters 11, 12 increase in unison, thereby shifting the power point 19 of FIG. 2, the composite center frequency 29 of FIG. 3, and the composite transfer characteristic 27 uniformly to higher frequencies, as may be illustrated by the dashed line 40 in FIG. 3. Thus, the new composite center frequency of the system shifts upwardly and begins to seek the frequency of the input signal. As the composite center frequency approaches the frequency of the input signal, the output of the summing amplifier 26 is reduced, thereby stabilizing the output signal of the integrating circuit 31. This output signal, is, therefore, representative of the frequency of the input signal. The feedback loop acts to drive the error signal $e(t)$ to zero thereby tracking the frequency of the input signal. Since the output of the voltage controlled oscillator circuit 32 is proportional to the frequency of the input signal, a separate output 32*b* may be taken from the oscillator circuit 32 and this signal has a frequency which is a multiple of the frequency of the input signal. Thus, the system may also be used as a frequency multiplier for an input signal having a variable or changing frequency.

If, on the other hand, the frequency of the input signal is below the composite center frequency 29 of the digital filters 11, 12, then the output signal of the summing amplifier 26 is positive, causing the output signal of the integrator circuit 31 to increase and thereby decreasing the frequency of the voltage controlled oscillator circuit 32. This, in turn, causes a decrease in the clock pulse rate of the clock pulse generator 14 which reduces the sampling rate of the digital filters 11, 12. The reduced sampling rate causes the center frequency of the transfer characteristics 11*a*, 12*a* of the digital filters 11, 12 to decrease, thereby shifting the frequency characteristic to a lower value indicated by the curve in chain line 44 and also reducing the composite center frequency to that which is indicated by reference numeral 45.

Modern aircraft and missiles have evolved into systems which have high performance characteristics. The dynamic response of these vehicles has created a need for adaptive control systems that can provide positive control of rigid body motion as well as the structural bending modes of the vehicle in the presence of command inputs and atmospheric disturbances such as wind gusts or continuous turbulence. The transfer function of these vehicles (that is, the oscillatory response and the frequency range) is dependent upon the rigid body dynamics as well as the frequency of the structural dynamic modes (that is, the body-bending modes) of the vehicle. Furthermore, the frequency and amplitude of the body-bending mode vary with flight conditions and with flight time.

A control system designed for a particular flight condition would give completely unsatisfactory behavior at another flight condition even to the point of instability. The use of adaptive control systems that identify the vehicle transfer function in real time during flight and provide suitable compensation have been described and implemented on experimental aircraft such as the XB-70 and X-15.

Adaptive control techniques for aircraft can be divided into two parts, the process identification and the process compensation. While most adaptive control systems provide a variable gain control signal in the compensator, a sample data adaptive control system was proposed where the pole and zero locations of the system are changed by variation of the sampling rate in U. S. patent of Richard M. Willett entitled, "Method for Stabilizing Aircraft and Missiles," U.S. Pat. No. 3,572,618, issue date Mar. 30, 1971.

By varying the sampling rate, the body-bending poles are constrained to stay in a favorable position with respect to the compensation zeros. The present invention is useful in a system of the type described in the above-identified patent as the process identifier—that is, the system which identifies the instantaneous frequency of oscillation of the frame of an aircraft. A sensor or a plurality of sensors such as strain gauges attached at different locations to the flexible aircraft frame to generate signals representative of instantaneous bending frequency, and these signals are fed to the input of the digital filters 11, 12 of the embodiment of FIG. 1. The output signal of the integrator circuit 31 is representative of the instantaneous bending frequency.

Persons skilled in the art will appreciate that the system just described will work without the integrator circuit 31; however, the overall accuracy of the system will be reduced somewhat. That is, the error signal, $e(t)$, is representative of the difference between the frequency being tracked and a known frequency — namely the composite center frequency of the filters when the sampling rate is the natural oscillating frequency of the voltage controlled oscillator 32. The integrator does improve system accuracy by driving the error signal to zero.

Having thus described in detail a preferred embodiment of the invention, persons skilled in the art will be able to modify certain of the structure which has been described and to substitute equivalent elements for those disclosed while continuing to practice the principle of the invention; and it is, therefore, intended that all such modifications and substitutions be covered as they are embraced within the spirit and scope of the appended claims.

We claim

1. A system for frequency discrimination comprising: first and second digital filters each having a variable sampling rate, the center frequency of the pass-band of each of said filters being displaced in frequency from a composite center frequency of both of said filters, said filters further receiving an input signal to be tracked; difference means receiving the output signals of said first and second digital filters for generating an error signal representative of the difference between said output signals; and means for varying the sampling interval of said first and second digital filter means in accordance with said error signal to cause said composite center frequency of said first and second digital filters to track said input signal.

2. The system of claim 1 wherein said last named means includes a voltage control oscillator circuit having a design frequency and being controlled to shift its frequency of oscillation in response to changes in said error signal; said system further including clock pulse generator means receiving the output signal of said voltage controlled oscillator means for generating sampling pulses to control the sampling rate of said first and second digital filter means.

3. The system of claim 1 further comprising integrator means for integrating said error signal, said last named means including voltage controlled oscillator means having a design frequency and controlled by the output signal of said integrator means to change the sampling rate of said first and second digital filter means.

4. The system of claim 1 further comprising first and second digital to analog converter means receiving respectively the output signals of said first and second digital filter means for generating analog signals representative of the respective outputs thereof; first and second detector circuit means receiving respectively the outputs of said first and second digital to analog converter circuit means; and a summing amplifier having a positive and a negative input receiving respectively the outputs of said first and second detector circuit means to generate said error signal.

5. A method of tracking the frequency of an input signal comprising feeding said signal to first and second digital filters each having a variable sampling rate and a pass-band with a center frequency respectively above and below a composite center frequency by an equal amount, each filter generating a signal representaive of the amplitude of the input signal within its associated pass-band, taking the difference of the output signals of said filters to generate an error signal representative of the difference between the frequency of said input signal and said composite center frequency, and changing the sampling rate of said filters in accordance with said error signal.

6. The method of claim 5 further comprising the step of integrating said error signal prior to said step of changing said sampling rates, thereby to drive said error signal to zero with feedback.

* * * * *